(12) United States Patent
Shin et al.

(10) Patent No.: US 10,020,435 B2
(45) Date of Patent: Jul. 10, 2018

(54) COMPOSITE THERMOELECTRIC MATERIAL, THERMOELECTRIC ELEMENT AND MODULE INCLUDING THE SAME, AND PREPARATION METHOD THEREOF

(71) Applicant: Samsung Electronics Co., Ltd., Suwon-si, Gyeonggi-do (KR)

(72) Inventors: Weon-ho Shin, Busan (KR); Jong wook Roh, Yongin-si (KR); Kyu-hyoung Lee, Hwaseong-si (KR); Dae-jin Yang, Gyeongsangbuk-do (KR); Sang-il Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/185,233

(22) Filed: Feb. 20, 2014

(65) Prior Publication Data

US 2014/0352750 A1 Dec. 4, 2014

(30) Foreign Application Priority Data

May 28, 2013 (KR) .................. 10-2013-0060613

(51) Int. Cl.
*H01L 35/14* (2006.01)
*C01B 19/00* (2006.01)
(52) U.S. Cl.
CPC .......... *H01L 35/14* (2013.01); *C01B 19/007* (2013.01); *C01P 2004/03* (2013.01); *C01P 2004/04* (2013.01); *C01P 2004/80* (2013.01); *C01P 2006/32* (2013.01); *C01P 2006/40* (2013.01)

(58) Field of Classification Search
CPC .............................. H01L 35/14; H01L 35/18
See application file for complete search history.

(56) References Cited

U.S. PATENT DOCUMENTS

| | | | |
|---|---|---|---|
| 6,060,657 | A | 5/2000 | Harman |
| 8,277,677 | B2 | 10/2012 | Kanatzidis et al. |
| 9,190,594 | B2 | 11/2015 | Kim et al. |
| 2008/0202575 | A1 | 8/2008 | Ren et al. |
| 2010/0025616 | A1 | 2/2010 | Kanatzidis et al. |
| 2010/0258154 | A1 | 10/2010 | Heremans et al. |
| 2011/0073797 | A1 | 3/2011 | Kanatzidis et al. |
| 2012/0001117 | A1 | 1/2012 | Haaß et al. |
| 2012/0111385 | A1 | 5/2012 | Ramanath et al. |

(Continued)

FOREIGN PATENT DOCUMENTS

| | | |
|---|---|---|
| KR | 1020100009521 A | 1/2010 |
| KR | 1020110109562 A | 10/2011 |
| KR | 1020130015402 A | 2/2013 |

(Continued)

OTHER PUBLICATIONS

Liu et al., "Thermoelectric Property Studies on Cu-Doped n-type CuxBi2Te2.7Se0.3 Nanocomposites", Adv. Energy Mater., Jan. 2011, 577-287.

*Primary Examiner* — Golam Mowla
(74) *Attorney, Agent, or Firm* — Cantor Colburn LLP

(57) ABSTRACT

A composite thermoelectric material comprising a matrix comprising a thermoelectric semiconductor; and a nanoscale heterophase dispersed in the matrix, wherein the thermoelectric semiconductor comprises an element belonging to Group 15 of the Periodic Table of the Elements, and the heterophase comprises a transition metal element.

27 Claims, 9 Drawing Sheets

(56) References Cited

U.S. PATENT DOCUMENTS

2012/0114961 A1\* 5/2012 Lee .................. H01L 35/16
428/570
2012/0186621 A1\* 7/2012 Kim .................. H01B 1/06
136/200

FOREIGN PATENT DOCUMENTS

KR 1020130121450 A 11/2013
KR 1020130126035 A 11/2013

\* cited by examiner

COMPOSITE THERMOELECTRIC MATERIAL, THERMOELECTRIC ELEMENT AND MODULE INCLUDING THE SAME, AND PREPARATION METHOD THEREOF

CROSS-REFERENCE TO RELATED APPLICATION

This application claims the benefit of and priority to Korean Patent Application No. 10-2013-0060613, filed on May 28, 2013, in the Korean Intellectual Property Office, and all the benefits accruing therefrom under 35 U.S.C. § 119, the content of which is incorporated herein in its entirety by reference.

BACKGROUND

1. Field

The present disclosure relates to a composite thermoelectric material, a thermoelectric element and a module including the composite thermoelectric material, and methods of preparing the composite thermoelectric material.

2. Description of the Related Art

The thermoelectric phenomenon provides reversible and direct energy conversion between heat and electricity. The thermoelectric phenomenon occurs when electrons and/or holes move in a thermoelectric material in response to a temperature gradient.

The thermoelectric phenomena include the Peltier effect, the Seebeck effect, and the Thomson effect. The Peltier effect refers to heat emission or absorption that occurs at a junction of dissimilar materials due to an external current applied to the two dissimilar materials, which are connected to each other by a junction therebetween. The Seebeck effect refers to an electromotive force that is generated due to a temperature difference between opposite ends of the two dissimilar materials which are connected to each other by the junction therebetween, and the Thomson effect refers to heat emission or absorption that occurs when a current flows in a material having a predetermined temperature gradient.

Low temperature waste heat may be converted directly into electricity, and vice versa, using the above-described thermoelectric phenomena. Thus, efficiency of energy utilization may be increased. Also, the thermoelectric material may be applied to a variety of fields such as a thermoelectric generator or a thermoelectric cooler.

Energy conversion efficiency of the thermoelectric material may be represented by a dimensionless figure of merit ZT defined by Equation 1 below:

$$ZT = \frac{S^2 \sigma T}{\kappa} \qquad \text{Equation 1}$$

wherein ZT is a figure of merit, S is a Seebeck coefficient, σ is an electrical conductivity, T is an absolute temperature, and K is a thermal conductivity.

To increase energy conversion efficiency, a thermoelectric material having a large Seebeck coefficient, a high electrical conductivity, and a low thermal conductivity is desired, but generally, the Seebeck coefficient, electrical conductivity, and thermal conductivity are interrelated and thus have a trade-off relationship.

A nanostructured material has a small particle size compared to a bulk material, and thus an intergranular density of the nanostructured material is greater than that of the bulk material. Accordingly, phonon scattering, which occurs at interfaces, is increased in the nanostructured material. When phonon scattering is increased, thermal conductivity decreases. Further, because the trade-off relationship between the Seebeck coefficient and the electric conductivity collapses due to a quantum confinement effect in a nanostructured material, the figure of merit ZT may be increased through use of a nanostructure.

A nanostructure may be in the form of, for example, a superlattice thin film, a nanowire, a nanoplate, or a quantum dots, but manufacture of the nanostructure is difficult, and a figure of merit ZT of such materials is low in a bulk phase.

Therefore, a bulk material that provides a simple manufacturing process and an increased figure of merit ZT is desired.

SUMMARY

Provided is a composite thermoelectric material with a nanostructure and which provides an increased figure of merit ZT.

Provided is a thermoelectric device including the composite thermoelectric material.

Provided is a thermoelectric module including the thermoelectric device.

Provided are methods of preparing the composite thermoelectric materials.

Additional aspects will be set forth in part in the description which follows and, in part, will be apparent from the description.

According to an aspect, a composite thermoelectric material includes: a matrix including a thermoelectric semiconductor; and a nanoscale heterophase dispersed in the matrix, wherein the thermoelectric semiconductor includes an element belonging to Group 15 of the Periodic Table of the Elements, and the heterophase includes a transition metal element.

Also disclosed is a composite thermoelectric material including: a matrix including a thermoelectric semiconductor of Formula 4, $$Bi_{2-x}Sb_xSe_{3-y}Te_y \qquad \text{Formula 1}$$

wherein 0≤x≤2, and 0≤y≤3, and a heterophase dispersed in the matrix and comprising compound of Formula 1, $$M_aX_b \qquad \text{Formula 1}$$

wherein M is a transition metal element, X is S, Se, Te, or a combination thereof, 0≤a≤1, and 0≤b≤1.

According to another aspect, a thermoelectric element including the composite thermoelectric material is provided.

According to another aspect, disclosed is a thermoelectric module including: a first electrode; a second electrode; and the thermoelectric element, wherein the thermoelectric element is interposed between the first electrode and the second electrode.

According to another aspect, disclosed is a method of preparing a composite thermoelectric material, the method including: providing a composite base material including a thermoelectric semiconductor and a transition metal element; and sintering the composite base material to prepare the composite thermoelectric material.

BRIEF DESCRIPTION OF THE DRAWINGS

These and/or other aspects will become apparent and more readily appreciated from the following description of the embodiments, taken in conjunction with the accompanying drawings in which:

FIGS. 1B to 1E are each element maps determined by electron probe micro analysis (EPMA) of the composite thermoelectric material of Example 1, in which FIG. 1B is a Se map, FIG. 1C is a Bi map, FIG. 1D is a Cu map, and FIG. 1E is a Te map;

DETAILED DESCRIPTION

Figure 1A:
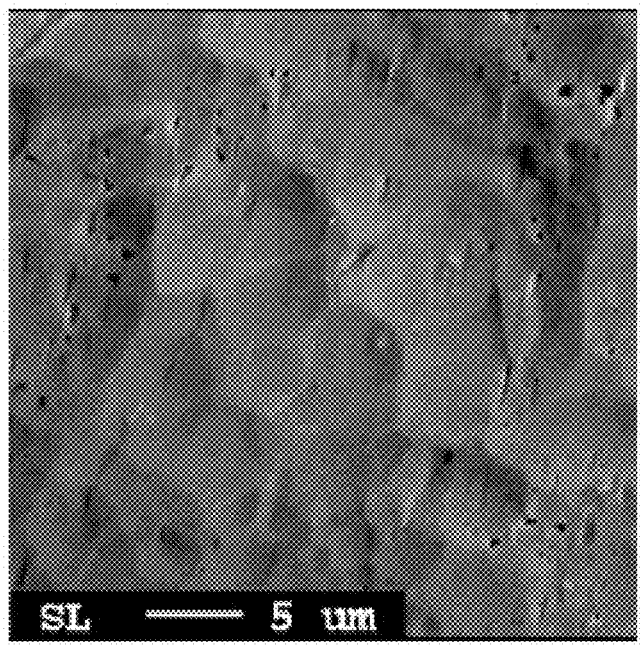
FIG. 1A is a scanning electron micrograph (SEM) of an embodiment of a composite thermoelectric material prepared according to Example 1.
Figure 1B:
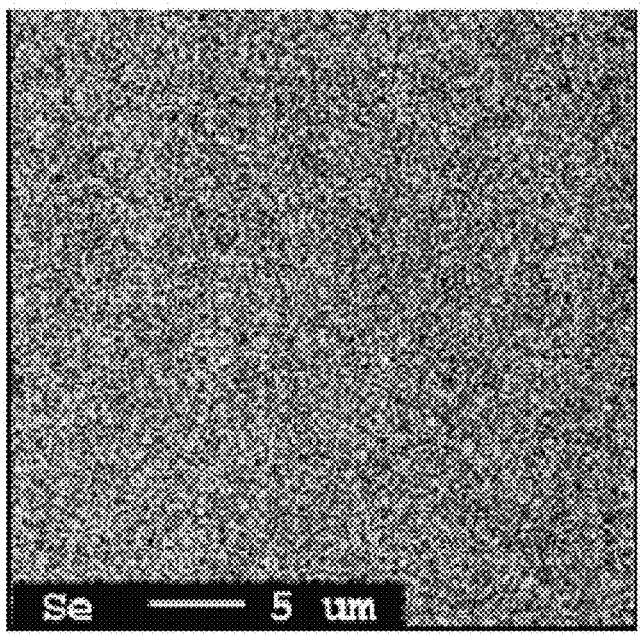
Figure 1C:
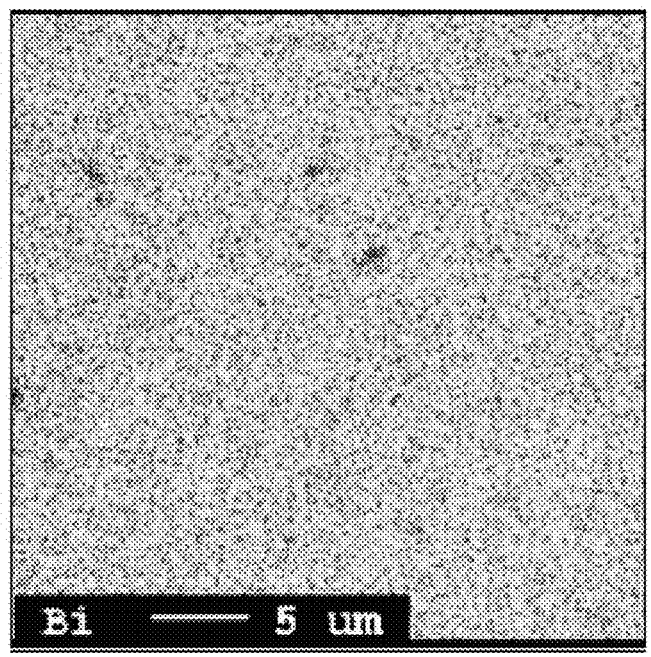
Figure 1D:
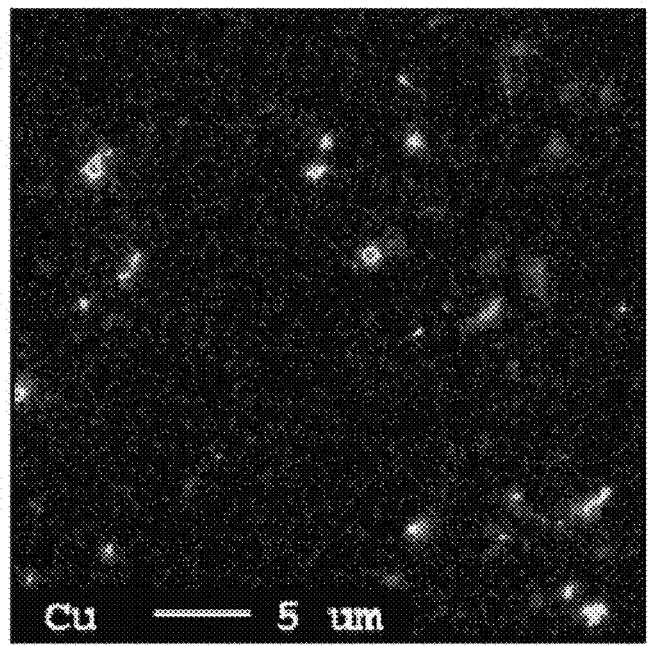
Figure 1E:
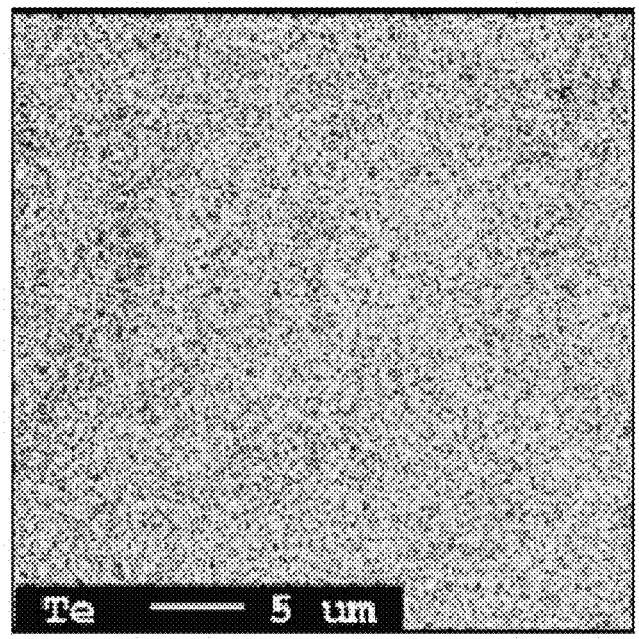

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. "Or" means "and/or." As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in any suitable order unless otherwise indicated herein or otherwise contradicted by context.

"Transition metal" as defined herein refers to an element of Groups 3 to 12 of the Periodic Table of the Elements.

"Group" means a group of the Periodic Table of the Elements according to the International Union of Pure and Applied Chemistry (IUPAC) Group 1-18 group classification system.

Hereinafter, a composite thermoelectric material, a thermoelectric device and a thermoelectric module including the same, and a method of preparing the thermoelectric material are disclosed in further detail.

According to an aspect, a composite thermoelectric material comprises a matrix comprising a thermoelectric semiconductor; and a nanoscale heterophase dispersed in the matrix, wherein the thermoelectric semiconductor includes an element belonging to Group 15 of the Periodic Table of the Elements, and the heterophase comprises a transition metal element. As used herein, "dispersed" means that the matrix comprises non-contacting particles of the heterophase. In an embodiment, about 40 weight percent (wt %) to about 99.9 wt %, specifically about 50 wt % to about 95 wt %, more specifically about 55 wt % to about 90 wt % of particles of the heterophase do not contact a nearest neighbor particle of the heterophase, based on a total weight of the heterophase.

In the composite thermoelectric material, an interface is formed between the nanoscale heterophase and the matrix, and accordingly the composite thermoelectric material has a nanostructure. While not wanting to be bound by theory, it is understood that the nanostructure results in increased phonon scattering because of phonon scattering at the interface, and thus the thermal conductivity of the composite thermoelectric material may be decreased. In the composite thermoelectric material, the matrix, which comprises the thermoelectric semiconductor, and the heterophase, have different compositions from each other, and thus carriers may be selectively transported by suitably selecting the compositions of the matrix and the heterophase. That is, and while not wanting to be bound by theory, a size of an energy barrier at the interface between the matrix and the heterophase may be selected by selecting the compositions of the matrix and the heterophase. In this regard, carriers that primarily contribute to a power factor (i.e., $S^2\sigma$ in Equation 1) may be selectively transported through the interface. The selective transport of such carriers is called a carrier filtering effect. Due to the carrier filtering effect, a Seebeck coefficient may be increased, and consequently, a figure of merit (ZT) may be increased.

In the composite thermoelectric material, the heterophase may be present in an intragrain region of the matrix, i.e., within a grain of the matrix, or in an intergrain region of the matrix, i.e., at a grain boundary between grains of the matrix. In particular, the phonon scattering may be desirably increased when the heterophase is disposed within a grain of the matrix. The heterophase may be formed when a compound including the transition metal element is precipitated in the matrix during sintering of a composite base material to form the heterophase as a secondary phase. The composite base material may have any suitable form, and may be a powder, for example.

The composite thermoelectric material may be nanostructured. Herein, the prefix "nano" refers to a component having a characteristic dimension less than 1 micrometer. In the composite thermoelectric material, the heterophase is nanostructured, and has an average particle size of less than 1 μm, specifically about 0.001 μm to about 0.5 μm, more specifically about 0.005 μm to about 0.1 μm. For example, the average particle size of the heterophase may be in a range from about 1 nanometer (nm) to about 900 nm, from about 1 nm to about 800 nm, from about 1 nm to about 700 nm, from about 1 nm to about 600 nm, from about 5 nm to about 600 nm, or from about 10 nm to about 600 nm. When the composite thermoelectric material includes the heterophase having the average particle size within the above ranges, the figure of merit ZT of the composite thermoelectric material may be further increased.

In the composite thermoelectric material, an amount of the heterophase may be at least 0.01 parts by weight, based on 100 parts by weight of the matrix. For example, the amount of the heterophase may be in a range from about 0.01 to about 50 parts by weight, from about 0.03 to about 40 parts by weight, from about 0.06 to about 30 parts by weight, from about 0.09 to about 20 parts by weight, from about 0.05 to 20 parts by weight, from about 0.08 to about 10 parts by weight, or from about 0.1 to about 5 parts by weight, based on 100 parts by weight of the matrix. When the composite thermoelectric material includes the heterophase in the amount of the above ranges, the figure of merit ZT may be further increased.

In some other embodiments, in the composite thermoelectric material, an amount of the heterophase may be at least 0.01 weight percent (wt %), based on a total weight of the composite thermoelectric material. For example, the amount of the heterophase may be in a range from about 0.01 wt % to about 33 wt %, from about 0.03 wt % to about 29 wt %, from about 0.06 wt % to about 23 wt %, from about 0.09 wt % to about 17 wt %, from about 0.05 wt % to about 17 wt %, from about 0.08 wt % to about 10 wt %, or from about 0.1 wt % to about 5 wt %, based on a total weight of the composite thermoelectric material. When the composite thermoelectric material includes the heterophase in the amount of the above ranges, the figure of merit ZT may be further increased.

In the composite thermoelectric material, the heterophase may comprise, or consist of, a compound comprising a transition metal element and an element belonging to Groups 13 to 16 of the Periodic Table of the Elements. In an embodiment, the heterophase is a compound comprising the transition metal element and the element belonging to Groups 13 to 16 of the Periodic Table of the Elements. The transition metal element may be an element of Groups 10 and 11, specifically Pd, Cu, Ag, or a combination thereof, for example. The element belonging to Groups 13 to 16 may be Si, Ge, Sb, Bi, S, Se, Te, or a combination thereof, specifically S, Se, Te, or a combination thereof, more specifically Te. When the heterophase includes the transition metal element and the element belonging to Groups 13 to 16 at the same time, the figure of merit ZT may be further increased. In some embodiments, the heterophase may be a chalcogenide compound of the transition metal element. The chalcogenide compound may be a precipitate, and may be a secondary phase.

In some embodiments, the heterophase may include a compound represented by Formula 1 below:

$$M_a X_b \qquad \text{Formula 1}$$

wherein M is a transition metal element, X is S, Se, Te, or a combination thereof, 0≤a≤1, and 0≤b≤1. In an embodiment, 0<a<1, for example 0.1≤a≤0.9, or 0.2≤a≤0.8. Also, b may be 0<b<1, for example 0.1≤b≤0.9, or 0.2≤b≤0.8.

In some embodiments, the heterophase may include a compound represented by Formula 2 below:

$$M'_a X_b \qquad \text{Formula 2}$$

wherein M' is an element of Groups 10 and 11 of the Periodic Table of the Elements, X is S, Se, Te, or a combination thereof, $0 \le a \le 1$, $0 \le b \le 1$ and $a+b>0$. In an embodiment, $0<a<1$, for example $0.1 \le a \le 0.9$, or $0.2 \le a \le 0.8$. Also, b may be $0<b<1$, for example $0.1 \le b \le 0.9$, or $0.2 \le a \le 0.8$.

In some embodiments, the heterophase may include a compound represented by Formula 3 below:

$$M''_a X_b \qquad \text{Formula 3}$$

wherein M" is Cu, Ag, Pd, or a combination thereof, X is S, Se, Te, or a combination thereof, $0 \le a \le 1$, $0 \le b \le 1$ and $a+b>0$. In an embodiment, $0<a<1$, for example $0.1 \le a \le 0.9$, or $0.2 \le a \le 0.8$. Also, b may be $0<b<1$, for example $0.1 \le b \le 0.9$, or $0.2 \le a \le 0.8$.

In the composite thermoelectric material, the thermoelectric semiconductor may be an n-type semiconductor. That is, the thermoelectric semiconductor may have an electron that acts as a carrier.

For example, the thermoelectric semiconductor may include a semiconductor comprising an element belonging to Groups 15 to 16 of the Periodic Table of the Elements and may be optionally doped. For example, the semiconductor may be a Group 15-Group 16 type semiconductor that is doped, i.e., comprises an additional element, or is undoped. The semiconductor may include a chalcogenide compound, e.g., a compound represented by Formula 4 below:

$$Bi_{2-x}Sb_x Se_{3-y}Te_y \qquad \text{Formula 4}$$

wherein $0 \le x \le 2$ and $0 \le y \le 3$. In an embodiment $0<x \le 2$, $0<x<2$, $0<x<2$, $0.1 \le x \le 0.8$, or $0.2 \le x \le 1.6$. Also, y may be $0<y \le 3$, $0 \le y<3$, $0<y<3$, $0.1 \le y \le 2.8$, or $0.2 \le y \le 2.6$.

In some embodiments, the thermoelectric semiconductor may include a compound selected from compounds represented by Formulas 5 to 7, or a combination thereof.

$$Bi_{2-x}Te_{3-y} \qquad \text{Formula 5}$$

wherein $0 \le x<2$ and $0 \le y<3$, $$Bi_{2-x}Se_{3-y} \qquad \text{Formula 6}$$

wherein $0 \le x<2$ and $0 \le y<3$, or $$Bi_{2-x}Se_{3-y}Te_{3-z} \qquad \text{Formula 7}$$

wherein $0 \le x<2$, $0 \le y<3$, and $0 \le z<3$. In an embodiment, in Formulas 5 and 6, $0<x<2$, for example $0.1 \le x \le 1.8$, or $0.2 \le x \le 1.6$, and y may be $0<y<3$, $0.1 \le y \le 2.8$, or $0.2 \le y \le 2.6$. Also, in Formula 7, in an embodiment, $0<x<2$, $0.1 \le x \le 1.8$, or $0.2 \le x \le 1.6$, and z may be $0<z<3$, for example $0.1 \le z \le 2.8$, or $0.2 \le z \le 2.6$.

The composite thermoelectric material may have a Figure of Merit ZT of about 1 or greater at a temperature about 300 Kelvin (K) to about 450 K, for example 360 K. Since the composite thermoelectric material has a structure in which the nanoscale heterophase is dispersed in the matrix and has a selected composition, the composite thermoelectric material may have a figure of merit ZT of 1 or greater, which is significantly increased compared to the figure of merit ZT of an alternative n-type thermoelectric material. In some embodiments, the composite thermoelectric material may have a figure of merit ZT of 1.1 or greater, 1.2 or greater, 1.3 or greater, or 1.4 or greater, or about 0.95 to about 2, or about 0.98 to about 1.5, at 360 K.

In the composite thermoelectric material, the particles of the heterophase may be single crystalline, polycrystalline, or a combination thereof.

In the composite nanomaterial, the matrix and the heterophase may form an epitaxial junction. When the matrix and the heterophase form the epitaxial junction at an interface between the matrix and the heterophase, electron scattering may be suppressed. An epitaxial junction can be provided by epitaxial growth, for example by growth of the heterophase in crystallographic registry with the matrix, e.g., along the same crystal axis as that of the matrix, to have the same crystal structure as that of the matrix. Due to the epitaxial growth, the epitaxial junction may be formed at the interface between the matrix and the heterophase. At the interface, the compositions of the crystals of the matrix and the heterophase may change, but the crystal structures of the matrix and the heterophase are not substantially changed, and may be the same. While not wanting to be bound by theory, it is understood that because of the epitaxial nature of the interface electron scattering may be suppressed at the interface, and accordingly the figure of merit ZT may be improved.

The composite thermoelectric material may be a bulk material. The bulk composite thermoelectric material may be a pressure-sintered material prepared by compressing and sintering a composite base material. The composite base material may be in the form of a powder.

The composite thermoelectric material may be pressure-sintered using any suitable method to prepare the composite thermoelectric material in a bulk form. For example, the composite thermoelectric material may be prepared in a bulk form by a hot process method. In the hot process method, the powder of the composite base material is disposed into a mold having a selected shape and is molded at a high temperature of, for example, about 300° C. to about 800° C., and at a high pressure of, for example, about 1 megaPascal (MPa) to about 300 MPa, or about 30 MPa to about 300 MPa. In some embodiments, the bulk form of the composite thermoelectric material may be prepared by a spark plasma sintering method. In the spark plasma sintering method, the composite base material is sintered in a short period of time, e.g., about 1 to 1000 seconds, under conditions of high pressure and high current, for example, a pressure of about 1 MPa to about 300 MPa, or about 30 MPa to about 300 MPa, and a current of about 50 amperes (A) to about 500 A, for example about 75 A to about 400 A. In some embodiments, the composite base material may be prepared by a hot forging method. In the hot forging method, when the composite base material is pressure-molded, the composite base material is pressure-sintered at a high temperature of, for example, about 300° C. to about 700° C.

Due to the pressure-sintering methods, the composite thermoelectric material may have a density in a range from about 70% to about 100% of a theoretical density, for example about 75% to about 99% of a theoretical density. The theoretical density is calculated by dividing a molecular weight by an atomic volume, and is evaluated by using a lattice constant. For example, the composite thermoelectric material may have a density in a range from about 95 to about 100% of a theoretical density, and accordingly may have an improved electrical conductivity.

Since the composite thermoelectric material may be prepared in various forms, a thin, high-efficiency thermoelectric device having a thickness of about 1 millimeter (mm) or less, e.g., 0.01 mm to 1 mm, or 0.05 mm to 0.9 mm, may be provided. The composite thermoelectric material may be easily prepared in a bulk form and may have a high figure of merit ZT when in the bulk form. Thus, the composite thermoelectric material may be suitable for many industrial uses.

The composite thermoelectric material may further contain an additional nanostructured phase, in addition to the matrix and the heterophase. For example, the composite thermoelectric material may further contain an additional nanostructured phase having a 1 dimensional (D), 2D, a 3D nanostructure, or a combination thereof. The additional nanostructured phase may comprise a nanotree, nanoplate, nanodisk, nanosheet, nanowire, nanofiber, nanobelt, nanotube, or a combination thereof. The additional nanostructured phase may comprise nanocrystals, and may be in a form of a nanopowder.

According to another aspect, a thermoelectric element includes the composite thermoelectric material. The thermoelectric element may be an n-type thermoelectric element. The thermoelectric element may have any suitable shape, may be rectilinear or curvilinear, and may be for example, a regular hexahedron, triangle, square, sphere, hemisphere, or rod.

When the thermoelectric element is connected to an electrode, a cooling effect may be generated by applying a current thereto. The thermoelectric element may also generate electrical power using a temperature difference.

According to another aspect, a thermoelectric module includes a first electrode, a second electrode, and a thermoelectric element interposed between the first electrode and the second electrode, wherein the thermoelectric element includes the composite thermoelectric material.

For example, the thermoelectric module may be configured to generate a current through the thermoelectric element when there is a temperature difference between the first electrode and the second electrode. In the thermoelectric module, the thermoelectric element may include the composite thermoelectric material. A first end of the thermoelectric element may be in contact with the first electrode, and a second end of the thermoelectric element may be in contact with the second electrode. When a temperature of the first electrode is increased to a temperature higher than a temperature of the second electrode, or when a temperature of the second electrode is decreased to a temperature lower than a temperature of the first electrode, a current flowing from the first electrode to the second electrode through the thermoelectric element may be generated. When the thermoelectric module is being operated, the first electrode and the second electrode may be electrically connected.

Moreover, the thermoelectric module may additionally include a third electrode, and accordingly may include an additional thermoelectric element that is interposed between the first electrode and the third electrode.

In some embodiments, the thermoelectric module may include a first electrode, a second electrode, a third electrode, a p-type thermoelectric element including a first end and a second end, and an n-type thermoelectric element including a first end and a second end. Here, the first end of the p-type thermoelectric element may be in contact with the first electrode while the second end of the p-type thermoelectric element is in contact with the third electrode. Also, the first end of the n-type thermoelectric element is in contact with the first electrode, while the second end of the n-type thermoelectric element is in contact with the second electrode. When a temperature of the first electrode is higher than a temperature of the second and third electrodes, a current, which flows from the second electrode to the first electrode through the n-type thermoelectric element and then from the first electrode to the third electrode through the p-type thermoelectric element, may be generated. When the thermoelectric module is being operated, the second electrode and the third electrode may be electrically connected. The n-type thermoelectric element may include the composite thermoelectric material.

The thermoelectric module may further include an insulating substrate on which at least one of the first electrode, the second electrode, and optionally the third electrode is disposed.

The insulating substrate may comprise any suitable insulator, e.g., gallium arsenic (e.g., GaAs), sapphire, silicon, Pyrex, quartz, or a combination thereof. The electrode may comprise any suitable conductor, e.g., aluminum, nickel, gold, titanium, or a combination thereof, and a size thereof may be also variously selected. The electrode may be patterned by any suitable patterning method, such as a lift-off semiconductor process, a deposition method, or a photolithography method, without limitation.

Figure 4:
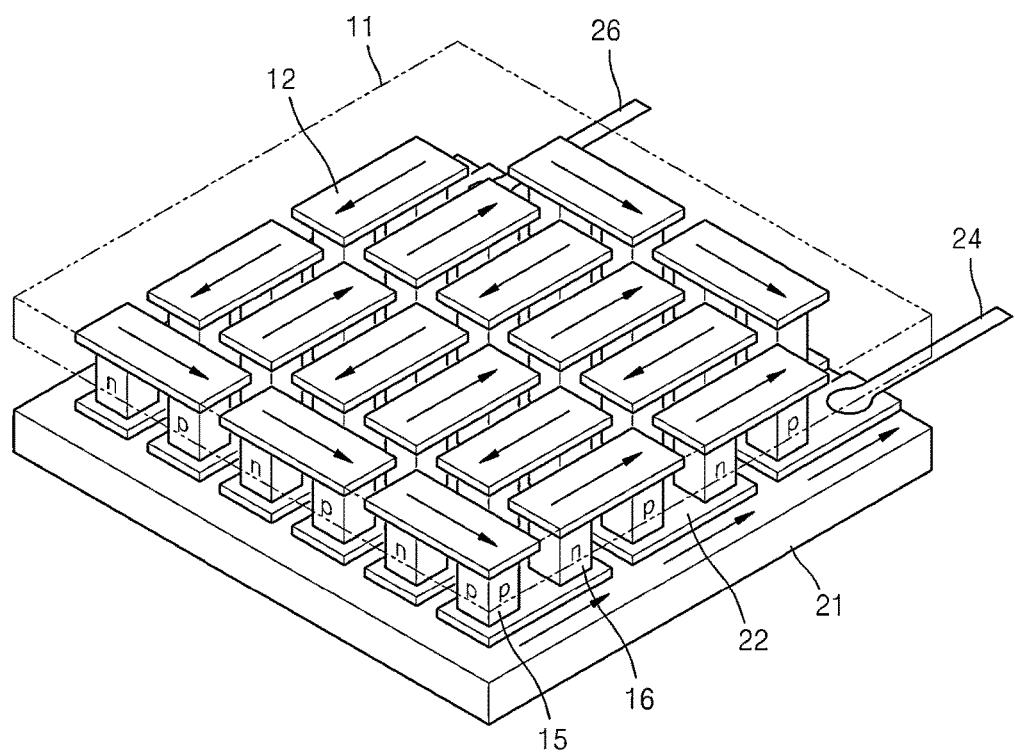
FIG. 4 is a schematic view of an embodiment of a thermoelectric module.

FIG. 4 is a schematic view of an embodiment of the thermoelectric module including an embodiment of the thermoelectric element. As illustrated in FIG. 4, a top electrode 12 and a bottom electrode 22 are disposed on a top insulating substrate 11 and a bottom insulating substrate 21, respectively. The top electrode 12 and the bottom electrode 22 are in contact with a p-type thermoelectric element 15 and an n-type thermoelectric element 16, respectively. The top electrode 12 and the bottom electrode 22 are connected to the outside of the thermoelectric module by first and second lead electrodes 24 and 26, respectively.

As illustrated in FIG. 4, the p-type thermoelectric element 15 and the n-type thermoelectric element 16 in the thermoelectric module may be alternately arranged, and the n-type thermoelectric element 16 may include the composite thermoelectric material.

In the thermoelectric module, one of the first electrode and the second electrode may be electrically connected to a power source. A temperature difference between the first electrode and the second electrode may be 1 degree (i.e., 1 K) or greater, 5 degrees or greater, 50 degrees or greater, 100 degrees or greater, or 200 degrees or greater. A temperature of each electrode may be suitable selected, so long as the temperature does not cause dissolution or current interference of a component of the thermoelectric module.

Figure 5:
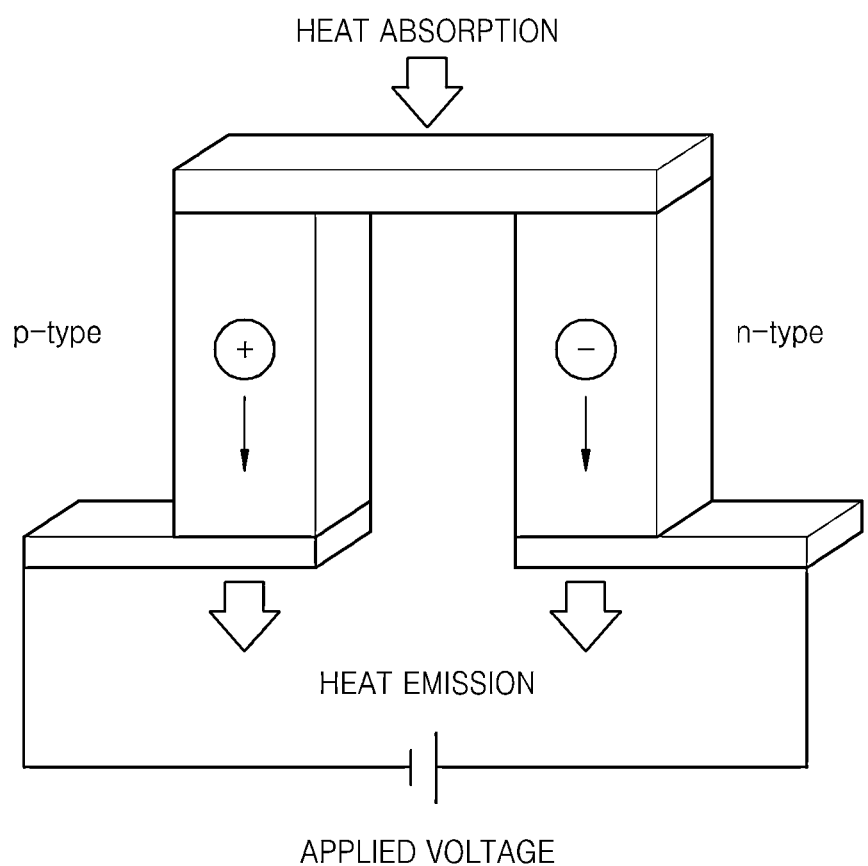
FIG. 5 is a schematic view of an embodiment of a thermoelectric cooler.
Figure 6:
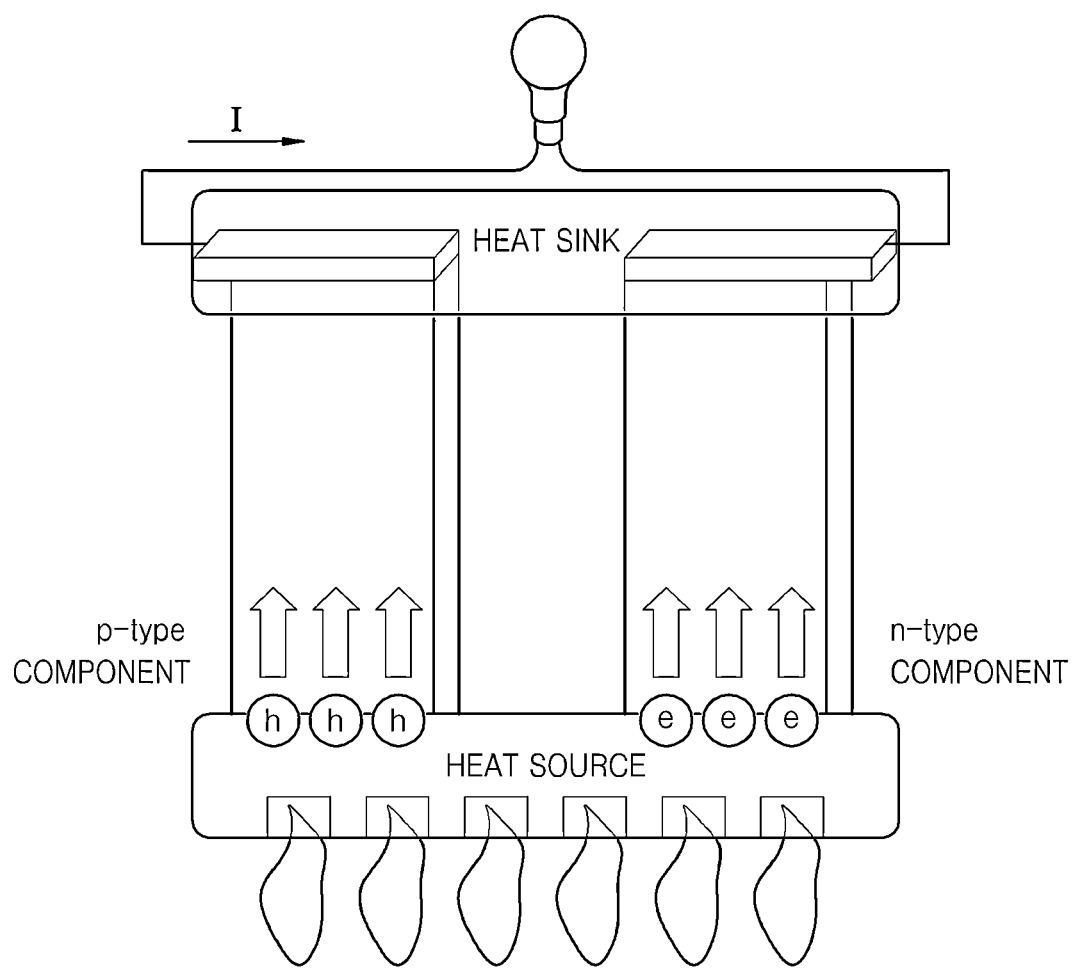
FIG. 6 is a schematic view of an embodiment of a thermoelectric generator.

In the thermoelectric module, one of the first electrode, the second electrode, and optionally the third electrode may be electrically connected to a power source as illustrated in FIG. 5. Alternatively, the electrodes of the thermoelectric module may be electrically connected to a component that consumes power (e.g., a light), or to a component stores power (e.g., a battery), as illustrated in FIG. 6.

The thermoelectric module may be included in a thermoelectric apparatus, such as a thermoelectric generator, a thermoelectric cooler, or a thermoelectric sensor, but examples of the thermoelectric apparatus are not limited thereto. Any suitable apparatus that may directly convert heat and electricity may be used. Additional details of the structure and manufacturing method of the thermoelectric cooling system may be determined by a skilled artisan without undue experimentation, and thus will not be described in further detail herein.

According to another aspect, a method of preparing a composite thermoelectric material includes providing, e.g., preparing, a composite base material comprising a thermoelectric semiconductor and a transition metal element; and sintering the composite base material to prepare the composite thermoelectric material. The composite base material may be in the form of a powder.

The preparing of the composite base material may comprise heating the thermoelectric semiconductor, the transition element, and S, Se, Te, or a combination thereof to prepare a melt, and then rapidly solidifying the melt to provide the composite base material. For example, the rapid solidification method may comprise a melt spinning method, a gas atomization method, a plasma deposition method, a centrifugal atomization method, or a splat quenching method, but is not limited thereto. In the rapid solidification method, any suitable rapid solidification method that is available in the art may be used. When the rapid solidification method is used, the composite thermoelectric material may be produced on a mass scale for industrial purposes. Even when a non-rapid solidification method is used, instead of the rapid solidification, the composite thermoelectric material may be obtained with improved properties.

In the preparation method, the composite base material may be prepared using a melt spinning method.

In some embodiments, a precursor (e.g., a raw metal) of the thermoelectric semiconductor is mixed at a selected content ratio, disposed in suitable container such as a quartz tube, vacuum-sealed, and melted for about 1 hour to about 5 hours, for example 1.5 hours to about 4 hours at a temperature in a range from about 800° C. to about 1200° C., for example about 850° C. to about 1100° C. Next, the tube is maintained for about 0.5 hours to about 2 hours, for example about 1 hour to about 2 hours at a temperature in a range from about 700° C. to about 500° C., for example about 750° C. to about 600° C. Then, the resultant is quenched, e.g., with water, to prepare the thermoelectric semiconductor in the form of an ingot.

In some embodiments, the thermoelectric semiconductor ingot and the heterophase precursor are then combined at a selected content ratio and ground, for example using a high energy ball mill for about 0.1 minute to about 10 minutes at a speed in a range from about 100 revolutions per minute (rpm) to about 2,000 rpm, to obtain a milled mixture. Then, the composite base material may be prepared in a ribbon shape by melt spinning method the milled mixture.

In regard to the melt spinning method, the thermoelectric semiconductor ingot and the heterophase precursor (e.g., a raw metal) may be combined at a selected content ratio, and the mixture is milled and molded to prepare the combined materials in a molded shape. The molded and combined materials may be prepared in a liquid state by heating the molded mixture at a temperature above a melting point. Then, the liquified mixture may be ejected through a nozzle onto a Cu wheel rotating at a high speed in a range of about 1,000 rpm to about 5,000 rpm in a chamber of the inert atmosphere or in a vacuum of about 0.1 to about 1 bar at room temperature, to obtain the composite base material in a ribbon shape.

Next, the composite base material may be prepared in the form of a powder from the ribbon shaped composite base material by any suitable method, such ball milling, attrition milling, high energy milling (e.g., in a rotator-stator mill such as a KADY mill), or jet milling, or by grinding in a mortar, but examples of the method are not limited thereto. Any suitable dry method in the art for preparing a powder by grinding a raw material may be used.

In some other embodiments, the composite base material powder may be prepared using a gas atomization method. Here, the thermoelectric semiconductor ingot and the heterophase precursor (e.g., a raw metal) are combined at a selected content ratio, and the mixture is molded to prepare a mixed material in a molded shape. The mixed material is prepared in a liquid state by heating the mixed material at a temperature above a melting point. When the liquified mixture is rapidly ejected through a nozzle into a space and quenched in the vacuum or the argon atmosphere at room temperature, the composite base material may be obtained in the form of a powder having particles having a spherical shape.

In the sintering of the composite base material, the composite base material may be sintered by a spark plasma sintering method under conditions of a temperature in a range from about 300° C. to about 800° C., e.g., about 350° C. to about 600° C., and a pressure from about 1 MPa to about 100 MPa, e.g., about 2 MPa to about 50 MPa, for about 1 minute to about 10 minutes, but the conditions are not limited thereto. The conditions may be suitable selected to increase the figure of merit ZT of the composite thermoelectric material.

In the sintering, the composite thermoelectric material may be formed by precipitating the heterophase as a secondary phase.

An embodiment will be disclosed in further detail with reference to the following examples. These examples are for illustrative purposes shall not limit the scope of the disclosed embodiments.

EXAMPLES

Preparation of a Composite Thermoelectric Material

Example 1: Preparation of a BiSeTe/Cu—Te Composite Thermoelectric Material with 0.4 Wt % of a Cu—Te Heterophase In order to prepare a thermoelectric semiconductor having a composition of $Bi_2Te_{2.7}Se_{0.3}$, the raw metals Bi, Te, and Se were mixed in a mole ratio of 2:2.7:0.3, respectively, and the mixture was put in a quartz tube and vacuum-sealed. Then, the sealed mixture was melted and cooled to prepare a thermoelectric semiconductor in the form of an ingot. Here, a total amount of the raw metals was 20 g. In regard to the melting and cooling processes, the sealed mixture was melted at a temperature of 1,000° C. for 3 hours, maintained at a temperature of 600° C. for 1 hour, and then quenched with water at room temperature to prepare the $Bi_2Te_{2.7}Se_{0.3}$ thermoelectric semiconductor in the form of an ingot.

4.32 g of the $Bi_2Te_{2.7}Se_{0.3}$ thermoelectric semiconductor in the form of an ingot, 0.04 g of Cu, and 1.08 g of Te were prepared and uniformly ground at a speed of 1,425 rpm for 2 minutes by a high energy ball mill method to prepare powder. Then, the obtained powder was used in a melt spinning method to prepare a composite base material in a ribbon shape. Here, the composite base material was melted inside a chamber, and then ejected via a nozzle onto a Cu wheel. The conditions inside the chamber were an argon atmosphere and a pressure of 0.4 bar, and the rotation speed of the Cu wheel were 4,000 rpm.

Figure 2:
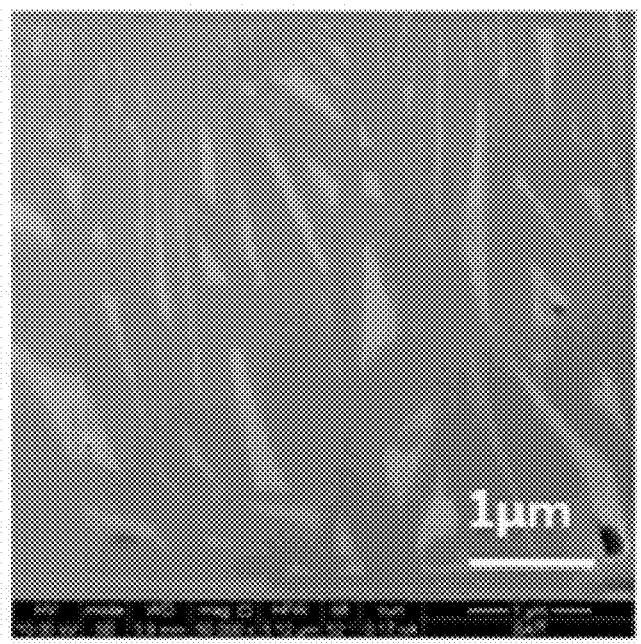
FIG. 2 is a SEM of a ribbon of the composite base material prepared in Example 1.

A scanning electron micrograph (SEM) of the ribbon shaped composite material is shown in FIG. 2.

The ribbon-shaped composite base material prepared by the melt spinning method was ground in a mortar to prepare a powder of the composite base material.

The powder of the composite base material was sintered by a spark plasma sintering method at a temperature of 500° C. for 2 minutes under conditions of a pressure and vacuum of 30 MPa, to prepare a composite thermoelectric material comprising $Bi_2Te_{2.7}Se_{0.3}$ matrix and a Cu—Te heterophase.

A SEM image and the results of Electron Probe Micro Analysis (EPMA) of the composite thermoelectric material are shown in FIGS. 1A to 1E.

As shown in FIGS. 1A to 1E, the heterophase including the Cu—Te compound is dispersed within the $Bi_2Te_{2.7}Se_{0.3}$ thermoelectric semiconductor matrix, confirming that the heterophase is disposed in an intragrain region (i.e., within a grain) of the matrix.

Figure 1F:
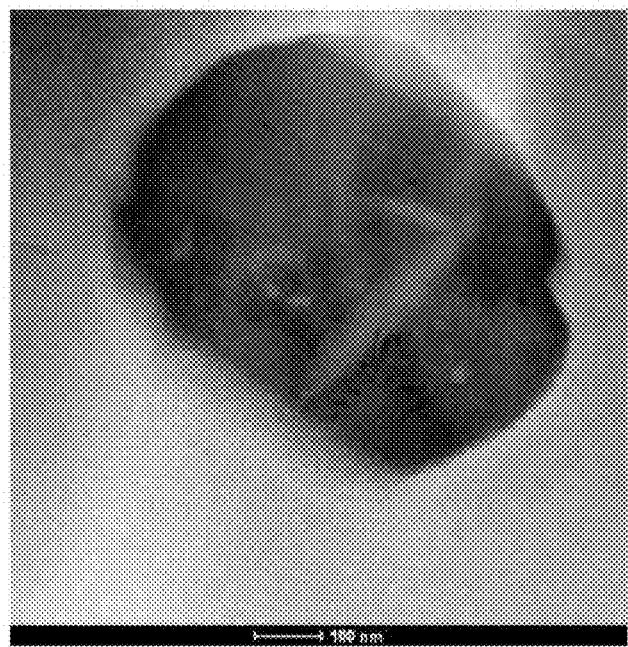
FIG. 1F is an enlarged view of a transmission electron micrograph (TEM) of the composite thermoelectric material of Example 1.

FIG. 1F is an enlarged view of a transmission electron microscope (TEM) image of the composite thermoelectric material, which confirms the presence of the heterophase.

The composition of the composite thermoelectric material was confirmed by Inductive Coupled Plasma (ICP) analysis. The total composition of the prepared composite thermoelectric material as determined by ICP is $(CuTe)_{0.016}Bi_2Te_{2.7}Se_{0.3}$.

Example 2: Preparation of a Composite Thermoelectric Material with 0.2 Wt % of a Cu—Te Heterophase A composite thermoelectric material was prepared in the same manner as in Example 1, except that 4.32 g of $Bi_2Te_{2.7}Se_{0.3}$ thermoelectric semiconductor in the form of an ingot, 0.02 g of Cu, and 1.08 g of Te were used.

Example 3: Preparation of a Composite Thermoelectric Material with 0.6 Wt % of a Cu—Te Heterophase A composite thermoelectric material was prepared in the same manner as in Example 1, except that 4.32 g of $Bi_2Te_{2.7}Se_{0.3}$ thermoelectric semiconductor in the form of an ingot, 0.06 g of Cu, and 1.08 g of Te were used.

Example 4: Preparation of a BiSeTe/Ag—Te Composite Thermoelectric Material with 1 Wt % of a Ag—Te Heterophase A composite thermoelectric material was prepared in the same manner as in Example 1, except that 4.32 g of $Bi_2Te_{2.7}Se_{0.3}$ thermoelectric semiconductor in the form of an ingot, 0.03 g of Ag, and 1.08 g of Te were used instead of 4.32 g of the $Bi_2Te_{2.7}Se_{0.3}$ thermoelectric semiconductor in the form of an ingot, 0.04 g of Cu, and 1.08 g of Te.

Example 5: Preparation of a Composite Thermoelectric Material with 2 Wt % of a Ag—Te Heterophase A composite thermoelectric material was prepared in the same manner as in Example 4, except that 4.32 g of $Bi_2Te_{2.7}Se_{0.3}$ thermoelectric semiconductor in the form of an ingot, 0.06 g of Ag, and 1.08 g of Te were used.

Example 6: Preparation of a Composite Thermoelectric Material with 3 Wt % of a Ag—Te Heterophase A composite thermoelectric material was prepared in the same manner as in Example 4, except that 4.32 g of $Bi_2Te_{2.7}Se_{0.3}$ thermoelectric semiconductor in the form of an ingot, 0.09 g of Ag, and 1.08 g of Te were used.

Example 7: Preparation of a BiSeTe/Pd—Te Composite Thermoelectric Material with 0.3 Wt % of a Pd—Te Heterophase A composite thermoelectric material was prepared in the same manner as in Example 1, except that 4.32 g of $Bi_2Te_{2.7}Se_{0.3}$ thermoelectric semiconductor in the form of an ingot, 0.006 g of Pd, and 1.08 g of Te were used instead of 4.32 g of the $Bi_2Te_{2.7}Se_{0.3}$ thermoelectric semiconductor in the form of an ingot, 0.04 g of Cu, and 1.08 g of Te.

Example 8: Preparation of a Composite Thermoelectric Material with 1.5 Wt % of a Pd—Te Heterophase A composite thermoelectric material was prepared in the same manner as in Example 7, except that 4.32 g of $Bi_2Te_{2.7}Se_{0.3}$ thermoelectric semiconductor in the form of an ingot, 0.03 g of Pd, and 1.08 g of Te were used.

Example 9: Preparation of a Composite Thermoelectric Material with 3 Wt % of a Pd—Te Heterophase A composite thermoelectric material was prepared in the same manner as in Example 7, except that 4.32 g of $Bi_2Te_{2.7}Se_{0.3}$ thermoelectric semiconductor in the form of an ingot, 0.06 g of Pd, and 1.08 g of Te were used.

Comparative Example 1: Preparation of a BiSeTe Thermoelectric Material

To prepare a thermoelectric semiconductor having a composition of $Bi_2Te_{2.7}Se_{0.3}$, Bi, Te, and Se, which are raw metals, were mixed in a mole ratio of 2:2.7:0.3, respectively, and the mixture was put in a quartz tube and vacuum-sealed. Then, the sealed mixture was melted and cooled to prepare a thermoelectric semiconductor in the form of an ingot. The total amount of the raw metals was 20 g. In regard to the melting and cooling, the sealed mixture was melted at a temperature of 1,000° C. for 3 hours, maintained at a temperature of 600° C. for 1 hour, and then quenched with water at room temperature.

The $Bi_2Te_{2.7}Se_{0.3}$ thermoelectric semiconductor in the form of an ingot was ground at a speed of 1,425 rpm for 2 minutes by a high energy ball mill method to prepare a powder. Then, the obtained powder was used in a melt spinning method to prepare a thermoelectric semiconductor in a ribbon shape. In the melt spinning method, the conditions inside the chamber were an argon atmosphere and a pressure of 0.4 bar, and the speed of the Cu wheel was 4,000 rpm. The ribbon prepared by using the melt spinning method was ground in a mortar to prepare a thermoelectric semiconductor powder of the formula $Bi_2Te_{2.7}Se_{0.3}$.

The $Bi_2Te_{2.7}Se_{0.3}$ thermoelectric semiconductor powder was sintered by a spark plasma sintering method at a temperature of 500° C. for 2 minutes under conditions of a pressure and vacuum of 30 MPa, to prepare a $Bi_2Te_{2.7}Se_{0.3}$ thermoelectric material.

Evaluation Example 1

Figure 3A:
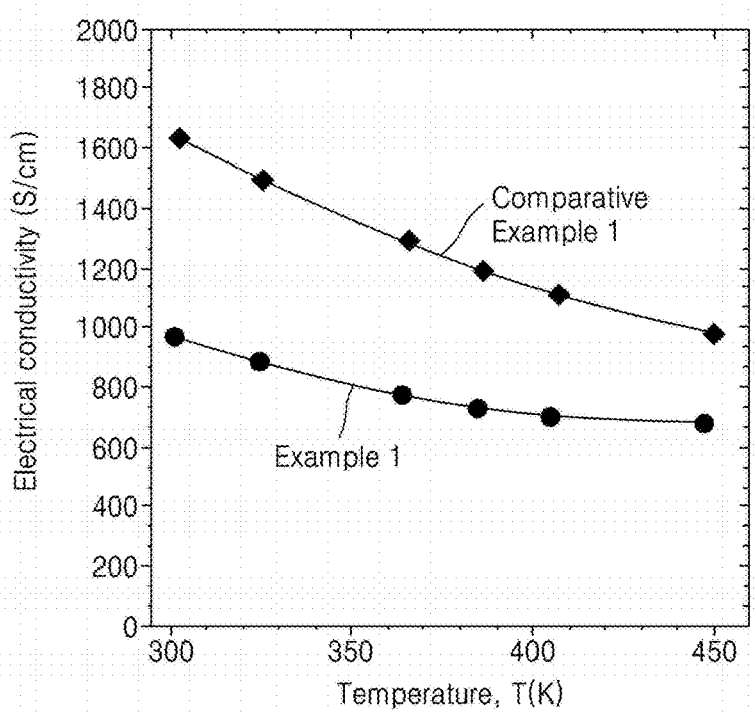
FIG. 3A is a graph of electrical conductivity (Siemens per centimeter, S/cm) versus temperature (Kelvin, K) showing electrical conductivities of thermoelectric materials prepared in Example 1 and Comparative Example 1.
Figure 3B:
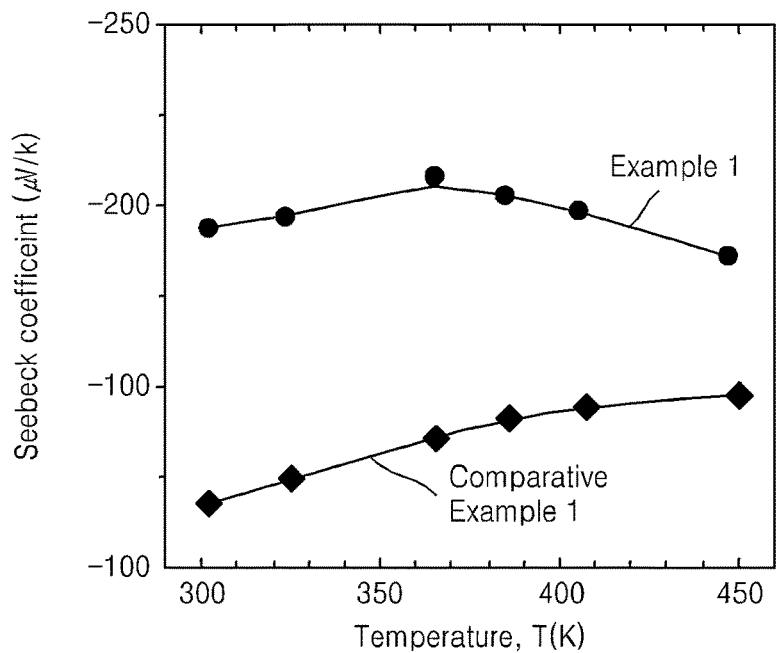
FIG. 3B is a graph of Seebeck coefficient (microvolts per Kelvin, μV/K) versus temperature (Kelvin, K) showing Seebeck coefficients of thermoelectric materials of Example 1 and Comparative Example 1.

Electrical conductivities and Seebeck coefficients of the thermoelectric materials prepared in Examples 1 to 9 and Comparative Example 1 were measured at the same time using ZEM-3 Seebeck coefficient/Electrical resistance instrument that is manufactured by ULVAC-RIKO Company, and some of the results are shown in FIGS. 3A and 3B, respectively.

Figure 3C:
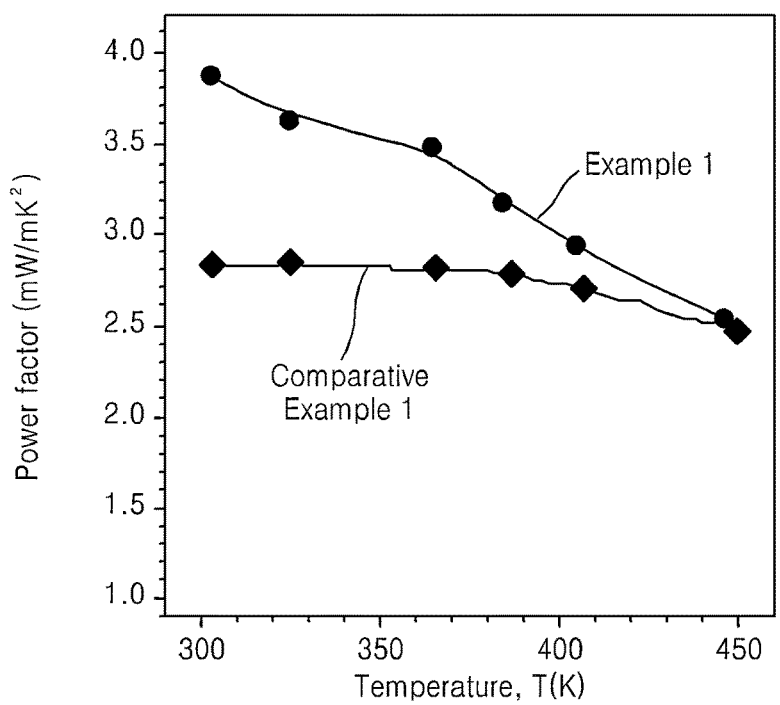
FIG. 3C is a graph of power factor (milliWatts per meter-square Kelvin, $mW/mK^2$) versus temperature (K) showing power factors of thermoelectric materials of Example 1 and Comparative Example 1.
Figure 3D:
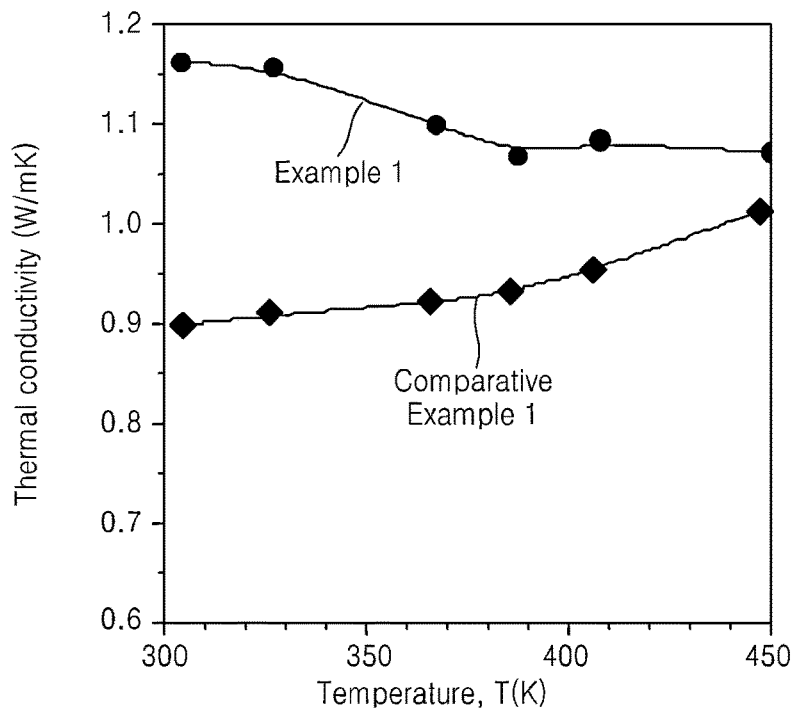
FIG. 3D is a graph of thermal conductivity (Watts per meter-Kelvin, W/mK) versus temperature (K) showing thermal conductivities of thermoelectric materials of Example 1 and Comparative Example 1.

The thermal conductivities were calculated from thermal diffusivity measured using a ULVAC TC-9000H instrument (which is a laser flash method), and the results are shown in FIG. 3D.

Figure 3E:
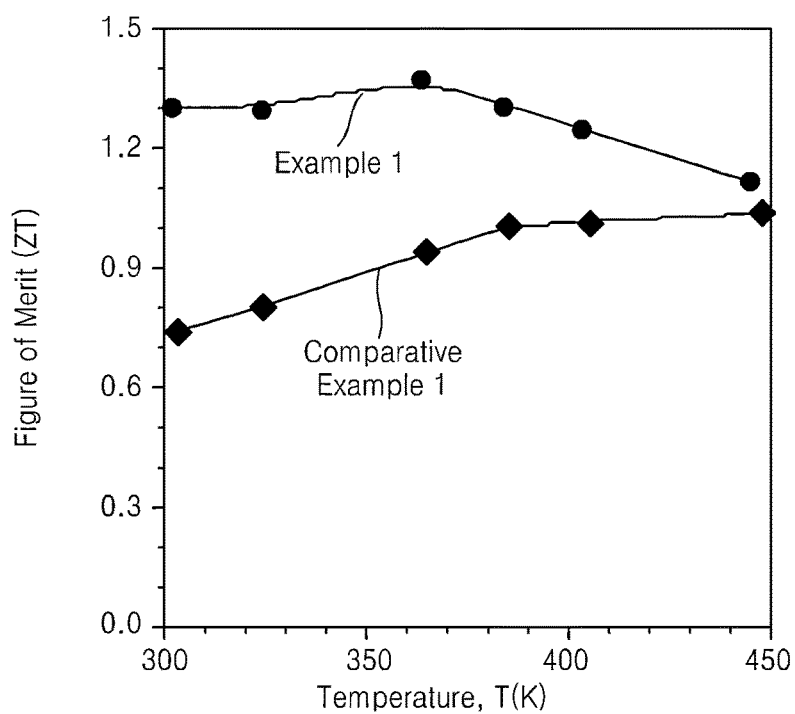
FIG. 3E is a graph of thermoelectric figure of merit (ZT) versus temperature (K) showing figures of merit (ZTs) of thermoelectric materials of Example 1 and Comparative Example 1.

Power factors and Figures of Merit (ZTs) calculated from the results above are shown in FIGS. 3C and 3E, respectively.

As shown in FIGS. 3A to 3E, the composite thermoelectric material including the heterophase as prepared in Example 1 exhibits a significant increase in the Seebeck coefficient and in the figure of merit ZT, compared to a thermoelectric material without the heterophase, as prepared in Comparative Example 1.

Also, the figures of merit ZTs at 300 K and 360 K of the thermoelectric material prepared in Examples 1 to 9 and Comparative Example 1 are shown in Table 1 below.

TABLE 1

|  | Figure of merit (ZT) at 300 K | Figure of merit (ZT) at 360 K |
| --- | --- | --- |
| Example 1 | 1.3 | 1.4 |
| Example 2 | 1.1 | 1.35 |
| Example 3 | 1.26 | 1.23 |
| Example 4 | 1.13 | 1.17 |
| Example 5 | 1.0 | 1.15 |
| Example 6 | 0.9 | 1.1 |
| Example 7 | 0.83 | 0.91 |
| Example 8 | 0.87 | 0.98 |
| Example 9 | 0.8 | 0.9 |
| Comparative Example 1 | 0.7 | 0.9 |

As shown in Table 1 above, the thermoelectric materials prepared in Examples 1 to 9 have the Figures of Merit (ZTs) that are significantly increased compared to those of Comparative Example 1.

As described above, according to the one or more of the above embodiments, a nanoscale heterophase dispersed within a thermoelectric semiconductor matrix is included in a thermoelectric material. While not wanting to be bound by theory, it is understood that phonon scattering increases, and carrier transport is improved, to provide an increased a thermoelectric figure of merit ZT of the thermoelectric material.

It should be understood that the exemplary embodiments disclosed herein shall be considered in a descriptive sense only and not for purposes of limitation. Descriptions of features, advantages, or aspects within each embodiment shall be considered as available for other similar features, advantages, or aspects in other embodiments.

What is claimed is:

1. A composite thermoelectric material comprising:
a matrix comprising a thermoelectric semiconductor; and
a nanoscale heterophase dispersed in the matrix,
wherein the nanoscale heterophase comprises a compound represented by Formula 1:

$$M_aX_b \quad \text{Formula 1}$$

wherein M is a transition metal element, X is S, Se, Te, or a combination thereof, $0<a\le1$, and $0.1<b\le1$, and
wherein the thermoelectric semiconductor comprises an element belonging to Group 15 of the Periodic Table of the Elements, and
wherein the heterophase is disposed within an intragrain region of an individual grain of the matrix.

2. The composite thermoelectric material of claim 1, wherein an average particle size of the heterophase is in a range from about 1 nanometer to about 600 nanometers.

3. The composite thermoelectric material of claim 1, wherein the heterophase is contained in the matrix in an amount of at least 0.01 part by weight, based on 100 parts by weight of the matrix.

4. The composite thermoelectric material of claim 1, wherein the heterophase comprises a compound comprising a transition metal element and an element belonging to Groups 13 to 16 of the Periodic Table of the Elements.

5. The composite thermoelectric material of claim 1, wherein the heterophase comprises a compound represented by Formula 2:

$$M'_aX_b \quad \text{Formula 2}$$

wherein M' is an element belonging to Groups 10 and 11 of the Periodic Table of the Elements, X is S, Se, Te, or a combination thereof, $0<a\le1$, and $0.1<b\le1$.

6. The composite thermoelectric material of claim 5, wherein the heterophase comprises a compound represented by Formula 3:

$$M''_aX_b \quad \text{Formula 3}$$

wherein M'' is Cu, Ag, Pd, or a combination thereof, X is S, Se, Te, or a combination thereof, $0<a\le1$, and $0.1<b\le1$.

7. The composite thermoelectric material of claim 6, wherein X is Te.

8. The composite thermoelectric material of claim 1, wherein the thermoelectric semiconductor is an n-type semiconductor.

9. The composite thermoelectric material of claim 1, wherein the thermoelectric semiconductor comprises elements belonging to Groups 15 and 16 of the Periodic Table of the Elements.

10. The composite thermoelectric material of claim 9, wherein the thermoelectric semiconductor comprises a chalcogenide compound.

11. The composite thermoelectric material of claim 9, wherein the thermoelectric semiconductor comprises a compound represented by Formula 4:

$$Bi_{2-x}Sb_xSe_{3-y}Te_y \quad \text{Formula 4}$$

wherein in Formula 4 $0\le x\le 2$, and $0\le y\le 3$.

12. The composite thermoelectric material of claim 11, wherein the thermoelectric semiconductor comprises a compound represented by Formulas 5 to 7, or a combination thereof:

$$Bi_{2-x}Te_{3-y}, \quad \text{Formula 5}$$

wherein in Formula 5 $0\le x<2$ and $0\le y<3$, $$Bi_{2-x}Se_{3-y}, \quad \text{Formula 6}$$

wherein in Formula 6 $0\le x<2$ and $0\le y<3$, or $$Bi_{2-x}Se_{3-y}Te_{3-z}, \quad \text{Formula 7}$$

wherein in Formula 7 $0\le x<2$, $0\le y<3$, and $0\le z<3$.

13. The composite thermoelectric material of claim 1, further comprising an epitaxial junction between the matrix and the heterophase.

14. The composite thermoelectric material of claim 1, wherein a figure of merit ZT is at least 1.0 at a temperature in a range from about 300 K to about 450 K.

15. A composite thermoelectric material comprising:
a matrix comprising a thermoelectric semiconductor of Formula 4, $$Bi_{2-x}Sb_xSe_{3-y}Te_y \quad \text{Formula 4}$$

wherein $0\le x\le 2$, and $0\le y\le 3$, and
a heterophase dispersed in the matrix and comprising compound of Formula 1, $$M_aX_b \quad \text{Formula 1}$$

wherein M is a transition metal element, X is S, Se, Te, or a combination thereof, $0\le a\le 1$, and $0.1\le b\le 1$, and wherein the heterophase is disposed within an intragrain region of an individual grain of the matrix.

16. The composite thermoelectric material of claim 15, wherein x is 0.

17. The composite thermoelectric material of claim 16, wherein M is an element belonging to Groups 10 and 11 of the Periodic Table of the Elements.

18. A thermoelectric element comprising the composite thermoelectric material of claim 1.

19. A thermoelectric module comprising:
a first electrode;
a second electrode; and
the thermoelectric element of claim 18, wherein the thermoelectric element is interposed between the first electrode and the second electrode.

20. A method of preparing a composite thermoelectric material, the method comprising:
providing a composite base material comprising a thermoelectric semiconductor and a transition metal element; and
sintering the composite base material to prepare the composite thermoelectric material, wherein the composite thermoelectric material comprises
a matrix comprising a thermoelectric semiconductor; and
a nanoscale heterophase dispersed in the matrix,
wherein the nanoscale heterophase comprises a compound represented by Formula 2:

$$M'_a X_b \qquad \text{Formula 2}$$

wherein M' is an element belonging to Groups 10 and 11 of the Periodic Table of the Elements, X is S, Se, Te, or a combination thereof, $0<a\leq 1$, and $0.1<b\leq 1$, and wherein the thermoelectric semiconductor comprises an element belonging to Group 15 of the Periodic Table of the Elements, and
wherein the heterophase is disposed within an intragrain region of an individual grain of the matrix.

21. The method of claim 20, wherein the providing the composite base material comprises:
heating the thermoelectric semiconductor, the transition element, and S, Se, Te, or a combination thereof to prepare a melt, and
solidifying the melt to provide the composite base material.

22. The method of claim 21, wherein the solidifying is by melt spinning, gas atomization, plasma deposition, centrifugal atomization, or splat quenching.

23. The method of claim 20, wherein the sintering is performed at a temperature in a range from about 300° C. to about 800° C. and at a pressure in a range from about 1 megaPascal to about 100 megaPascals for about 1 minute to about 10 minutes.

24. The method of claim 23, wherein the sintering comprises spark plasma sintering.

25. The method of claim 20, wherein the composite base material is in the form of a powder.

26. The composition thermoelectric material of claim 1, wherein the thermoelectric semiconductor comprises $Bi_2Te_{2.7}Se_{0.3}$.

27. The composition thermoelectric material of claim 1, wherein X is Te and M is selected from the group consisting of Cu, Ag, Pd, or a combination thereof.

* * * * *